(12) United States Patent
Chang et al.

(10) Patent No.: US 8,246,846 B1
(45) Date of Patent: Aug. 21, 2012

(54) METHOD FOR FABRICATING INTEGRATED MEMS SWITCHES AND FILTERS

(75) Inventors: David T. Chang, Calabasas, CA (US); Tsung-Yuan Hsu, Westlake Village, CA (US)

(73) Assignee: HRL Laboratories, LLC, Malibu, CA (US)

( * ) Notice: Subject to any disclaimer, the term of this patent is extended or adjusted under 35 U.S.C. 154(b) by 147 days.

(21) Appl. No.: 12/889,687

(22) Filed: Sep. 24, 2010

Related U.S. Application Data

(62) Division of application No. 12/233,232, filed on Sep. 18, 2008.

(51) Int. Cl.
*C23F 3/00* (2006.01)
(52) U.S. Cl. ............. 216/80; 216/13; 216/58; 438/719; 438/723
(58) Field of Classification Search .................. 216/13, 216/22, 24, 26, 27, 72, 80, 95; 438/637, 438/652, 706, 719, 720
See application file for complete search history.

(56) References Cited

U.S. PATENT DOCUMENTS

| 6,917,138 | B2 | 7/2005 | Nguyen | 310/311 |
| 7,237,315 | B2 | 7/2007 | Kubena et al. | 29/594 |
| 7,855,442 | B2 * | 12/2010 | Magerlein et al. | 257/686 |
| 8,097,492 | B2 * | 1/2012 | Magerlein et al. | 438/108 |
| 2003/0076006 | A1 * | 4/2003 | Suzuki | 310/309 |
| 2005/0017313 | A1 * | 1/2005 | Wan | 257/415 |
| 2005/0158905 | A1 | 7/2005 | Kubena et al. | 438/48 |
| 2008/0034575 | A1 * | 2/2008 | Chang et al. | 29/594 |

* cited by examiner

*Primary Examiner* — Lan Vinh
(74) *Attorney, Agent, or Firm* — Ladas & Parry

(57) ABSTRACT

A method for fabricating integrated MEMS switches and filters includes forming cavities in a silicon substrate, metalizing a first pattern on a quartz substrate to form first switch and filter elements, bonding the quartz substrate to the silicon substrate so that the first switch and filter elements are located within one of the cavities, thinning the quartz substrate, forming conductive vias in the quartz substrate, metalizing a second pattern on a second surface of the quartz substrate to form second switch and filter elements, etching the quartz substrate to separate MEMS switches from filters, forming protrusions on a host substrate, metalizing a third metal pattern on the host substrate to form metal anchors and third switch elements, compression bonding the metal anchors on the host substrate to second switch and filter elements, forming signal lines to integrate the MEMS switches and filters and removing the silicon substrate.

21 Claims, 11 Drawing Sheets

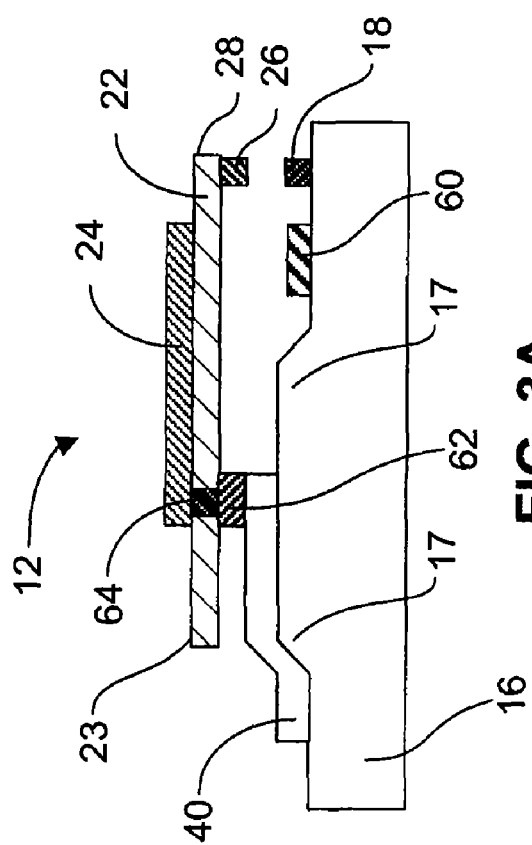
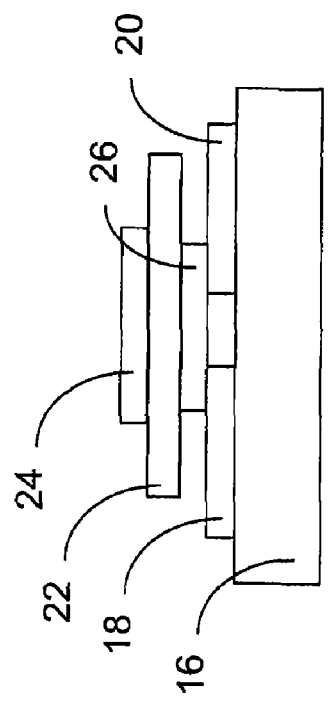
FIG. 3A
FIG. 3B (A)

| 210 | ETCHING THE QUARTZ SUBSTRATE TO FORM A PLURALITY OF FIRST QUARTZ SUBSTRATES AND A PLURALITY OF SECOND QUARTZ SUBSTRATES, EACH FIRST QUARTZ SUBSTRATE HAVING A RESPECTIVE ONE OF THE FIRST METAL OFFSETS, A RESPECTIVE ONE OF THE FIRST CONDUCTIVE VIAS, A RESPECTIVE ONE OF THE FIRST ACTUATION ELECTRODES AND A RESPECTIVE ONE OF THE METAL SWITCH CONTACTS, AND EACH FIRST QUARTZ SUBSTRATE HAVING A RESPECTIVE ONE OF THE PAIRED FIRST AND SECOND CAPACITOR PLATES AND A RESPECTIVE ONE OF THE PAIRED THIRD AND FOURTH CAPACITOR PLATES |

| 212 | FORMING ONE OR MORE PROTRUSIONS ON A HOST SUBSTRATE |

| 214 | METALIZING A THIRD METAL PATTERN ON THE HOST SUBSTRATE TO FORM A PLURALITY OF FIRST METAL ANCHORS, A PLURALITY OF SECOND METAL ANCHORS, A PLURALITY OF THIRD METAL ANCHORS, ONE OR MORE SECOND ACTUATION ELECTRODES, ONE OR MORE FIRST METAL SIGNAL LINES, AND ONE OR MORE SECOND METAL SIGNAL LINES, EACH FIRST, SECOND AND THIRD METAL ANCHOR OVERLAYING A RESPECTIVE ONE OF THE PROTRUSIONS |

| | |
|---|---|
| CONNECTING EACH FIRST METAL OFFSET TO A RESPECTIVE ONE OF THE FIRST METAL ANCHORS ON THE HOST SUBSTRATE SO THAT EACH FIRST ACTUATION ELECTRODE IS SUBSTANTIALLY ALIGNED OVER A RESPECTIVE ONE OF THE SECOND ACTUATION ELECTRODES, EACH METAL SWITCH CONTACT IS ALIGNED OVER A RESPECTIVE ONE OF THE FIRST SIGNAL LINES AND OVER A RESPECTIVE ONE OF THE SECOND SIGNAL LINES, EACH PAIRED FIRST AND SECOND CAPACITOR PLATES ARE SUBSTANTIALLY ALIGNED OVER A RESPECTIVE ONE OF THE PAIRED THIRD AND FOURTH CAPACITOR PLATES, EACH THIRD CAPACITOR PLATE IS ELECTRICALLY CONNECTED TO A RESPECTIVE ONE OF THE SECOND METAL ANCHORS, EACH FOURTH CAPACITOR PLATE IS ELECTRICALLY CONNECTED TO A RESPECTIVE ONE OF THE THIRD METAL ANCHORS, AND AT LEAST ONE OF THE SECOND METAL ANCHORS IS CONNECTED TO A RESPECTIVE ONE OF THE SECOND SIGNAL LINES IN ORDER TO FORM AN INTEGRATED MEMS SWITCH AND FILTER | 216 |

| | |
|---|---|
| REMOVING THE SILICON SUBSTRATE | 218 |

FIG. 8C

THE STEP OF FORMING ONE OR MORE FIRST CONDUCTIVE VIAS, EACH FIRST CONDUCTIVE VIA CONNECTED TO A RESPECTIVE ONE OF THE FIRST ACTUATION ELECTRODES FURTHER COMPRISES FORMING ONE OR MORE SECOND CONDUCTIVE VIAS IN THE QUARTZ SUBSTRATE, EACH SECOND CONDUCTIVE VIA CONNECTED TO A RESPECTIVE ONE OF THE FIRST CAPACITOR PLATES OR TO A RESPECTIVE ONE OF THE SECOND CAPACITOR PLATES — 230

THE STEP OF METALIZING A SECOND METAL PATTERN ON A SECOND SURFACE OF THE QUARTZ SUBSTRATE TO FORM ONE OR MORE FIRST METAL OFFSETS, ONE OR MORE PAIRED THIRD AND FOURTH CAPACITOR PLATES, AND ONE OR MORE METAL SWITCH CONTACTS, EACH FIRST METAL OFFSET CONNECTED TO A RESPECTIVE ONE OF THE FIRST CONDUCTIVE VIAS FURTHER COMPRISES METALIZING THE SECOND SURFACE OF THE QUARTZ SUBSTRATE TO FORM ONE OR MORE SECOND METAL OFFSETS, EACH SECOND METAL OFFSET CONNECTED TO A RESPECTIVE ONE THE SECOND CONDUCTIVE VIAS — 232

THE STEP OF CONNECTING EACH FIRST METAL OFFSET TO A RESPECTIVE ONE OF THE FIRST METAL ANCHORS ON THE HOST SUBSTRATE SO THAT EACH FIRST ACTUATION ELECTRODE IS SUBSTANTIALLY ALIGNED OVER A RESPECTIVE ONE OF THE SECOND ACTUATION ELECTRODES, EACH METAL SWITCH CONTACT IS ALIGNED OVER A RESPECTIVE ONE OF THE FIRST SIGNAL LINES AND OVER A RESPECTIVE ONE OF THE SECOND SIGNAL LINES, EACH PAIRED FIRST AND SECOND CAPACITOR PLATES ARE SUBSTANTIALLY ALIGNED OVER A RESPECTIVE ONE OF THE PAIRED THIRD AND FOURTH CAPACITOR PLATES, EACH THIRD CAPACITOR PLATE IS ELECTRICALLY CONNECTED TO A RESPECTIVE ONE OF THE SECOND METAL ANCHORS, EACH FOURTH CAPACITOR PLATE IS ELECTRICALLY CONNECTED TO A RESPECTIVE ONE OF THE THIRD METAL ANCHORS, AND AT LEAST ONE OF THE SECOND METAL ANCHORS IS CONNECTED TO A RESPECTIVE ONE OF THE SECOND SIGNAL LINES IN ORDER TO FORM AN INTEGRATED MEMS SWITCH AND FILTER FURTHER COMPRISES CONNECTING EACH SECOND METAL OFFSET TO A RESPECTIVE ONE OF A PLURALITY OF FOURTH METAL ANCHORS ON THE HOST SUBSTRATE

METHOD FOR FABRICATING INTEGRATED MEMS SWITCHES AND FILTERS

CROSS REFERENCE TO RELATED APPLICATION

This is a divisional application of U.S. patent application Ser. No. 12/233,232, filed on Sep. 18, 2008, which is incorporated herein as though set forth in full.

FIELD

This disclosure relates to a method for making an integrated MEMS switches and filters, and to integrated MEMS switches and high-Q filter devices.

BACKGROUND

Micro-electro-mechanical system (MEMS) switches are used in many applications. For example, U.S. Pat. No. 6,917,138 issued Jul. 12, 2005 to Clark T.-C. Nguyen describes forming a small, low-cost micro-mechanical RF channel selector with surface micromachined polysilicon resonators/filters. Even though Nguyen stresses the importance of having high Q in filters, polysilicon resonators are known to have low quality factors at ambient pressure, thus requiring costly vacuum packaging. The resulting size of the packaged filters makes packaging the filters in a large array difficult.

U.S. Patent Application Publication No. 2005/0158905 by Kubena et al. describes one method for fabricating a quartz nanoresonator which can be integrated on a substrate, along with other electronics and is incorporated herein by reference. However, that application does not teach how to fabricate integrated MEMS switches and filters.

What is needed is a method of making integrated MEMS switches and filters that do not experience significant damping and quality degradation even in air. Also there is a need for a method for seamless integration of MEMS switches with quartz filters to reduce their size and cost. The embodiments of the present disclosure answer these and other needs.

SUMMARY

In a first embodiment disclosed herein, a method for fabricating integrated MEMS switches and filters includes forming one or more first cavities and one or more second cavities in a silicon substrate, metalizing a first metal pattern on a first surface on a quartz substrate to form one or more first actuation electrodes, one or more paired first and second capacitor plates, bonding the quartz substrate to the silicon substrate so that each first actuation electrode is located within a respective one of the first cavities and each paired first and second capacitor plates are located within a respective one of the second cavities, thinning the quartz substrate, forming one or more first conductive vias in the quartz substrate, each first conductive via connected to a respective one of the first actuation electrodes, metalizing a second metal pattern on a second surface of the quartz substrate to form one or more first metal offsets, one or more paired third and fourth capacitor plates, and one or more metal switch contacts, each first metal offset connected to a respective one of the first conductive vias, etching the quartz substrate to form a plurality of first quartz substrates and a plurality of second quartz substrates, each first quartz substrate having a respective one of the first metal offsets, a respective one of the first conductive vias, a respective one of the first actuation electrodes and a respective one of the metal switch contacts, and each first quartz substrate having a respective one of the paired first and second capacitor plates and a respective one of the paired third and fourth capacitor plates, forming one or more protrusions on a host substrate, metalizing a third metal pattern on the host substrate to form a plurality of first metal anchors, a plurality of second metal anchors, a plurality of third metal anchors, one or more second actuation electrodes, one or more first metal signal lines, and one or more second signal lines, each first, second and third metal anchor overlaying a respective one of the protrusions, connecting each first metal offset to a respective one of the first metal anchors on the host substrate so that each first actuation electrode is substantially aligned over a respective one of the second actuation electrodes, each metal switch contact is aligned over a respective one of the first signal lines and over a respective one of the second signal lines, each paired first and second capacitor plates are substantially aligned over a respective one of the paired third and fourth capacitor plates, each third capacitor plate is electrically connected to a respective one of the second metal anchors, each fourth capacitor plate is electrically connected to a respective one of the third metal anchors, and at least one of the second metal anchors is connected to a respective one of the second signal lines in order to form an integrated MEMS switch and filter and removing the silicon substrate.

In another embodiment disclosed herein, a device having integrated MEMS switches and filters includes a host substrate having a plurality of first protrusions each having a first metal anchor, a plurality of second protrusions each having a second metal anchor, and a plurality of third protrusions, each having a third metal anchor, one or more MEMS switches on the host substrate, each MEMS switch comprising a first metal offset connected to a respective one of the first metal anchors, a first quartz substrate, each first quartz substrate having a first conductive via and cantilevered on the first metal offset, a first metal actuator electrode on the first quartz substrate and electrically connected to the first conductive via, a metal switch contact on the first quartz substrate, a second metal actuator electrode on the host substrate, and a first metal signal line on the host substrate; a second metal signal line on the host substrate, the metal switch contact aligned over the first metal signal line and the second metal signal line and one or more filters on the host substrate, each filter comprising a second quartz substrate, a first resonator on the quartz substrate, a second resonator on the quartz substrate, the second resonator separated from the first resonator by a gap, the first resonator connected to a respective one of the second metal anchors, and the second resonator connected to a respective one of the third metal anchors, wherein at least a respective one of the second metal anchors is connected to at least a respective one of the second metal signal lines to form an integrated MEMS switch and filter.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 3A and 3B are elevation sectional views of a MEMS switch in accordance with the present disclosure;

FIGS. 8A to 8C are flow diagrams showing the steps for fabricating integrated micro-electro-mechanical switches and filters in accordance with the present disclosure; and FIGS. 9A to 9B are flow diagrams showing further steps for fabricating integrated micro-electro-mechanical switches and filters in accordance with the present disclosure.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
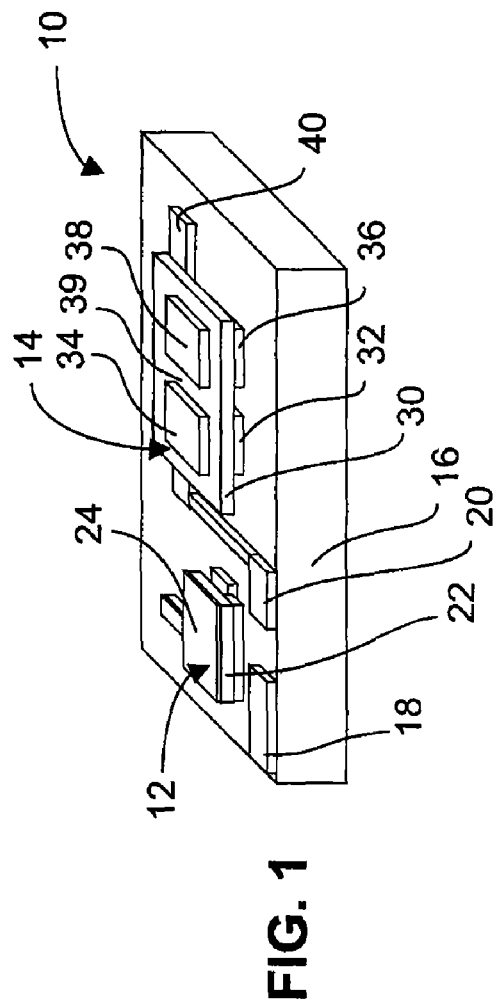
FIG. 1 is a perspective view of an integrated MEMS switch and filter in accordance with the present disclosure.

Referring to FIG. 1, an integrated MEMS switch and filter 10 is shown. The integrated MEMS switch is built on a host substrate 16. A first signal line 18 is connected to a second signal line 20 when the MEMS switch 12 is closed. The MEMS switch can be actuated by applying a voltage across two actuator electrodes, and when actuated the MEMS switch completes the electrical connection between the first signal line 18 and the second signal line 20. The MEMS switch is discussed further below in reference to FIG. 3.

The second signal line 20 is connected in FIG. 1 to filter 14, which is built on quartz substrate 30 to form a two-pole quartz filter. The filter is made of two quartz resonators with an acoustical gap 39 between the two resonators. Capacitor plates 32 and 34 form a first resonator and capacitor plates 36 and 38 form a second resonator. The first and second resonators together with the gap 39 between the resonators form a high-Q filter. The filter input signal is connected to capacitor plate 32 in the first resonator and travels acoustically through the quartz substrate to the second resonator. The filter output 40 is connected to capacitor plate 36 in the second resonator. The resonant frequency of the filter is a function of the thickness of the quartz substrate.

The integrated MEMS switch and filter 10 has many possible applications. Applications for such a device include any application that uses switches and filters. Military and aerospace applications include communications, navigation, radar, electro-optical sensors, guidance systems, fuzes and electronic warfare. Industrial applications include communications, instrumentation, computers, modems, engine controls, and sensors. Consumer applications include watches, clocks, radio, television, VCRs, DVRs, and medical devices.

Figure 2:
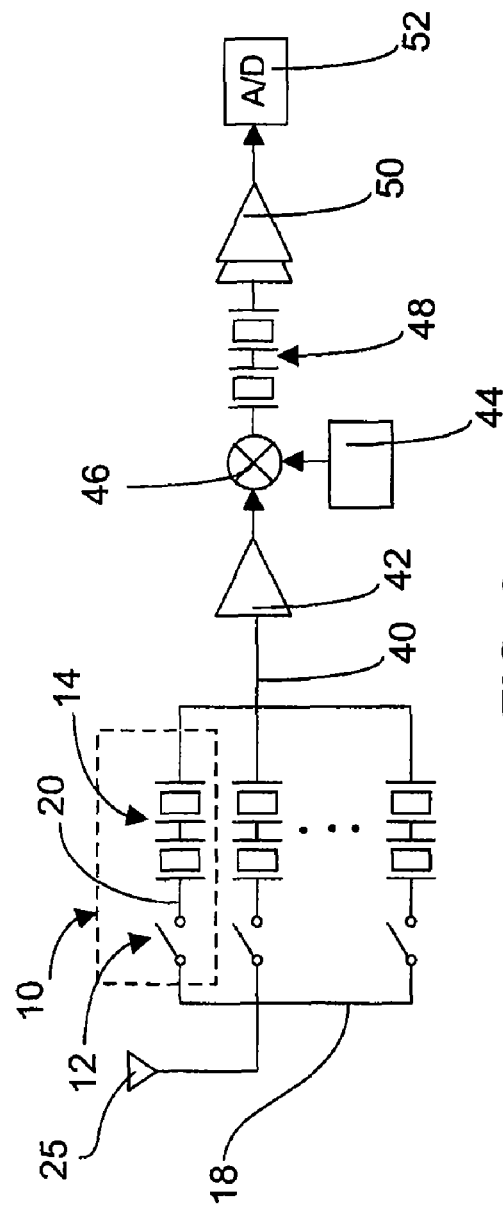
FIG. 2 is an exemplary circuit using an integrated MEMS switch and filter in accordance with the present disclosure.

One example application is shown in FIG. 2, which shows a circuit for an RF channel selector that uses the integrated MEMS switch and filter 10. An RF signal can be received, for example, by antenna 25 and then distributed by first signal line 18 to a bank of MEMS switches and filters. Each MEMS switch 12 and filter 14 can be implemented with an integrated MEMS switch and filter 10. Once a selected MEMS switch 12 is actuated and closed, the first signal line 18 is connected to the respective second signal line 20. The filter 14 filters the RF input signal to only pass signal within a desired frequency bandwidth. The filter output line 40 can then be amplified by amplifier 42, modulated in mixer 46 with a signal from a voltage controlled oscillator 44, filtered further by filter 48, amplified by amplifier 50 and finally sent to an analog to digital converter 52. In this circuit the filter 48 can also be implemented with a quartz filter according to this disclosure.

FIG. 3A is an elevation sectional view of a MEMS switch 12 in accordance with the present disclosure, and is a portion of the integrated MEMS switch and filter 10. As, shown, the MEMS switch 12 is fabricated on a host substrate 16 that has a protrusion 17. Overlaying the protrusion is a metal anchor 40. The protrusion 17 provides a vertical offset from the host substrate 16. The metal anchor provides an electrical contact for connecting the MEMS switch to control circuitry (not shown). A first metal offset 62 is connected to the metal anchor 40 and provides a further vertical offset and an electrical connection. A quartz substrate 22, which has a conductive via 64, is cantilevered on the metal offset 62. The conductive via 64 is a hole in the quartz substrate 22 that is metalized to provide an electrical connection to the top surface 23 of the ceramic substrate 22. A first metal actuator electrode 24 is on the top surface of the quartz substrate 22 and is electrically connected to the conductive via 64 and thereby to the metal anchor 40. A metal switch contact 26 is on a bottom surface of the quartz substrate 22 and can be positioned near one edge of the ceramic substrate 22. A second metal actuator electrode 60 is on the host substrate 16 and is positioned below the first actuator electrode 24. A first signal line 18 and a second signal line 20, as shown in FIG. 3B, are on the host substrate and the metal switch contact 26 is aligned over the first signal line 18 and the second signal line 20. The first signal line 18 and the second signal line 20 are metal lines on the host substrate 16. The second signal line 20 may be connected to a filter 14 as shown in FIGS. 1 and 2 to construct an integrated MEMS switch and filter.

The MEMS switch 12 is actuated by applying a voltage between the first metal actuator electrode 24 and the second metal actuator electrode 60. The voltages are applied by connecting control signals to metal anchor 40, which is electrically connected to the first metal actuator electrode 24, and to the second metal actuator electrode 60. Both the metal anchor 40 and the second metal actuator electrode 60 are located on the host substrate, which has metalized lines (not shown) to distribute control signals and connect to other circuitry. When a voltage is applied between the first metal actuator electrode 24 and the second metal actuator electrode 60, end 28 of the cantilevered quartz substrate 22 is pulled towards the host substrate 22 and the metal switch contact 26 contacts the first metal signal line 18 and the second metal signal line 20 to complete an electrical connection between them, as shown in FIG. 3B.

Figure 4A:
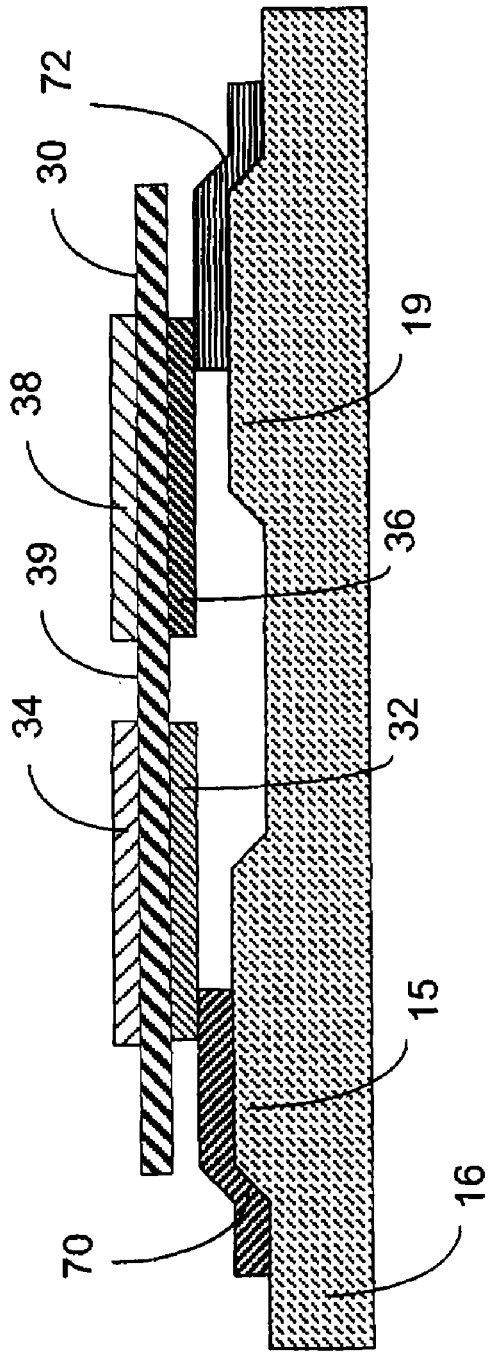
FIGS. 4A and 4B are elevation sectional views of a filter in accordance with the present disclosure.
Figure 4B:
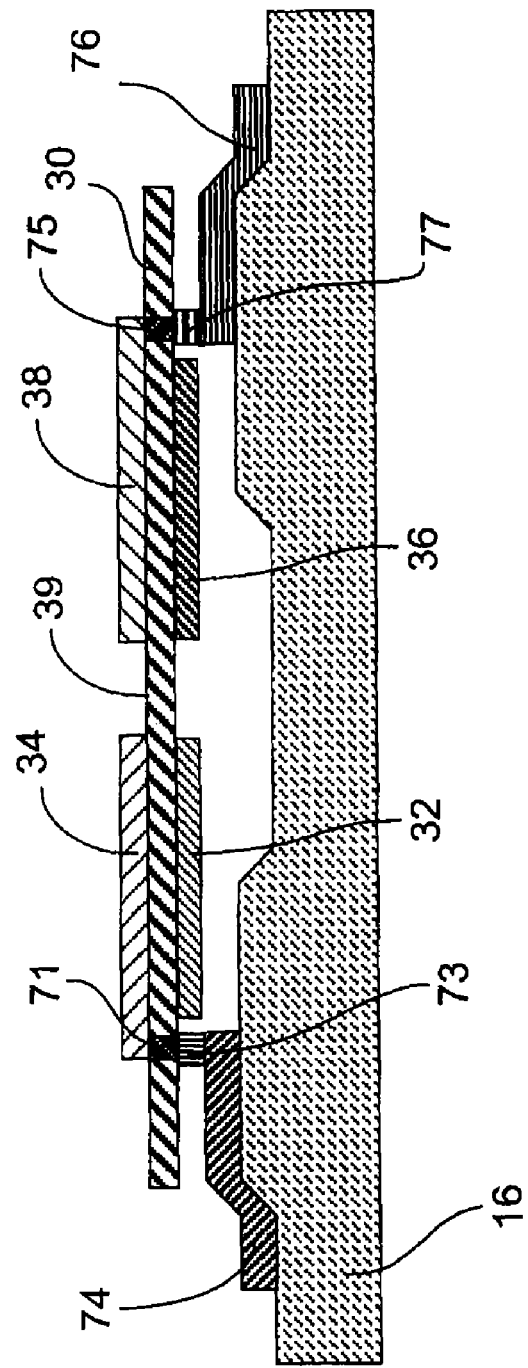

FIGS. 4A and 4B are elevation sectional views of a filter in accordance with the present disclosure. In FIG. 4A the host substrate 16 has two protrusions 15 and 19. These protrusions can be similar to protrusion 17 in FIG. 3. On these protrusions are metal anchors 70 and 72. A quartz substrate 30 has a first resonator connected to metal anchor 70 and a second resonator separated from the first resonator by the gap 39 and connected to metal anchor 72. The first resonator has a first capacitor plate 34 on a first surface of the quartz substrate and a second capacitor plate 32 on a second surface of the quartz substrate opposite the first surface. The second resonator has a third capacitor plate 38 on the first surface of the quartz substrate and a fourth capacitor plate 36 on the second surface of the quartz substrate opposite the first surface. The second capacitor plate 32 is electrically connected to metal anchor 70, and the fourth capacitor plate is electrically connected to a different one of the metal anchors 72.

The metal anchor 70 can be connected to second signal line 20 in order to connect the filter 14 to the switch 12 to form an integrated MEMS switch and filter. It should be understood that there are many embodiments of connections between a MEMS switch and a filter to form integrated MEMS switches and filters and that FIG. 2 shows only one such embodiment.

The first and second resonators together with the acoustic gap 39 between the resonators form a high-Q filter. The filter input signal is connected to capacitor plate 32 in the first resonator by a connection to metal anchor 70 and travels acoustically through the quartz substrate to the second resonator. The filter output 40 is connected to capacitor plate 36 in the second resonator by a connection to metal anchor 72. The resonant frequency of the filter is a function of the thickness of the quartz substrate.

In the embodiment of FIG. 4A capacitor plates 34 and 38 are not electrically connected and are floating. It may be desirable to ground the capacitor plates 34 and 38 in order to avoid floating metal, which presents quality issues for space and other applications. FIG. 4B shows an embodiment that includes connections to the capacitor plates 34 and 38. A conductive via 71 in the quartz substrate is electrically connected to capacitor plate 34 and conductive via 75 in the quartz substrate is electrically connected to capacitor plate 38. A metal offset 73 is electrically connected to conductive via 71 and also electrically connected to metal anchor 74. Another metal offset 77 is electrically connected to conductive via 75 and also electrically connected to metal anchor 76. Metal anchors 74 and 76 can be connected to an electrical ground so that capacitor plates 34 and 38 do not float.

The host substrate 16 for both the MEMS switch and the filter can be made of silicon or a material selected from the group consisting of III-V elements, such as GaAs or InP. The protrusions on the host substrate are about 5 micrometers tall.

The quartz substrate in one embodiment is a single crystal quartz substrate and the thickness of the quartz substrate is about 10 micrometers. The protrusions on the host substrate are about 5 micrometers tall.

Figure 5:
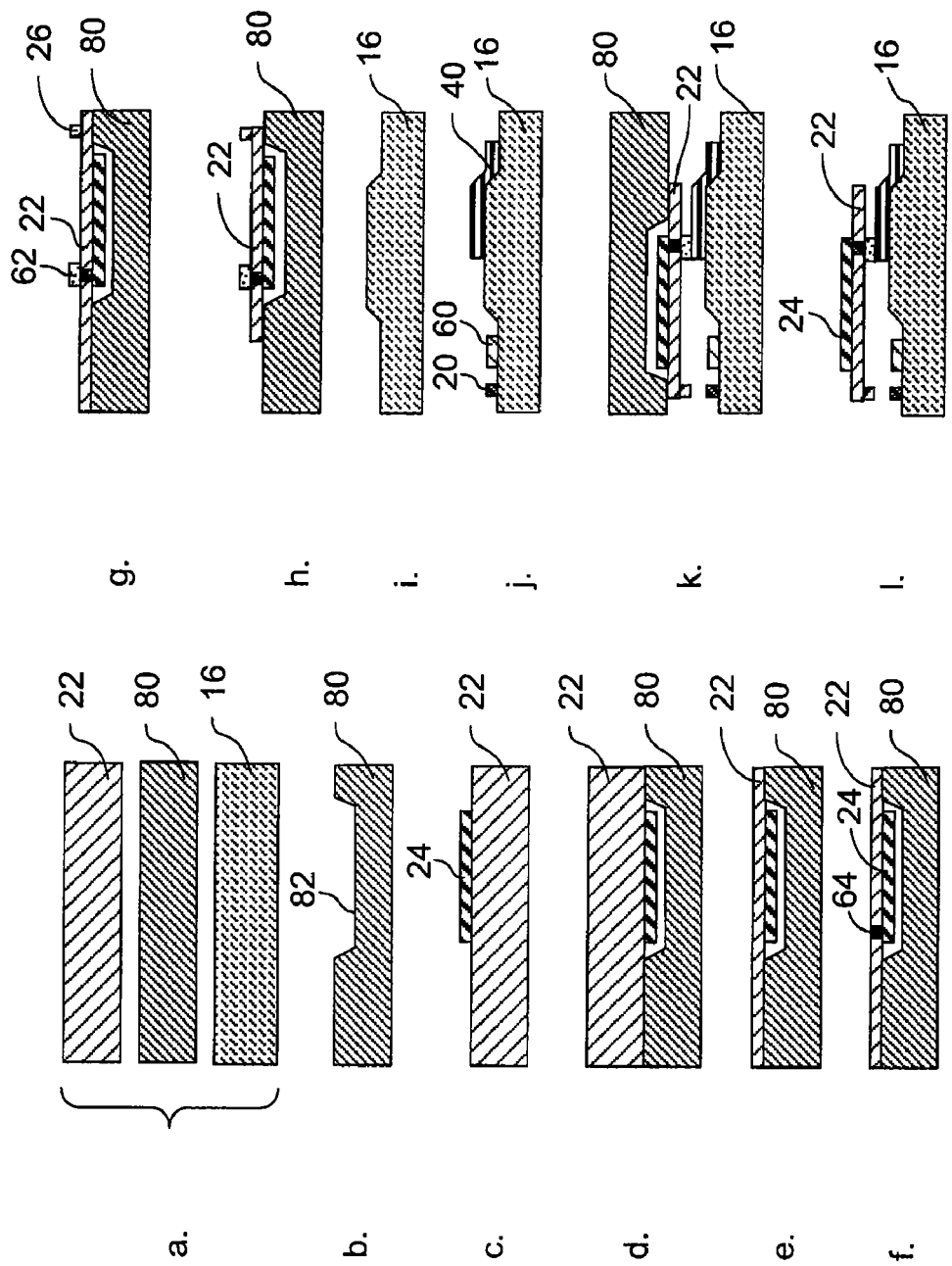
FIG. 5 shows the fabrication sequence for making a MEMS switch in accordance with the present disclosure.
Figure 6:
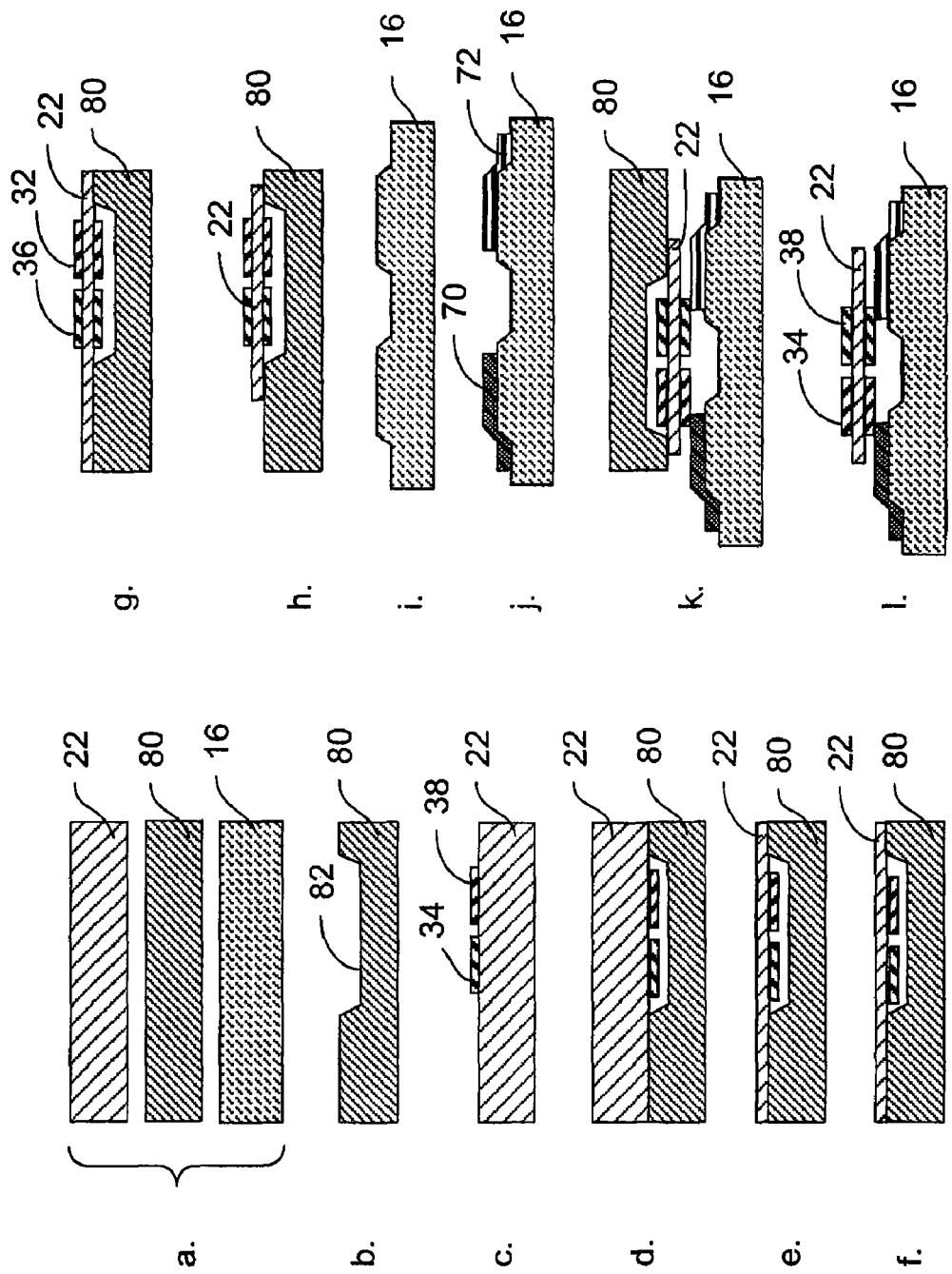
FIGS. 6 and 7 show the fabrication sequence for making a filter in accordance with the present disclosure.
Figure 7:
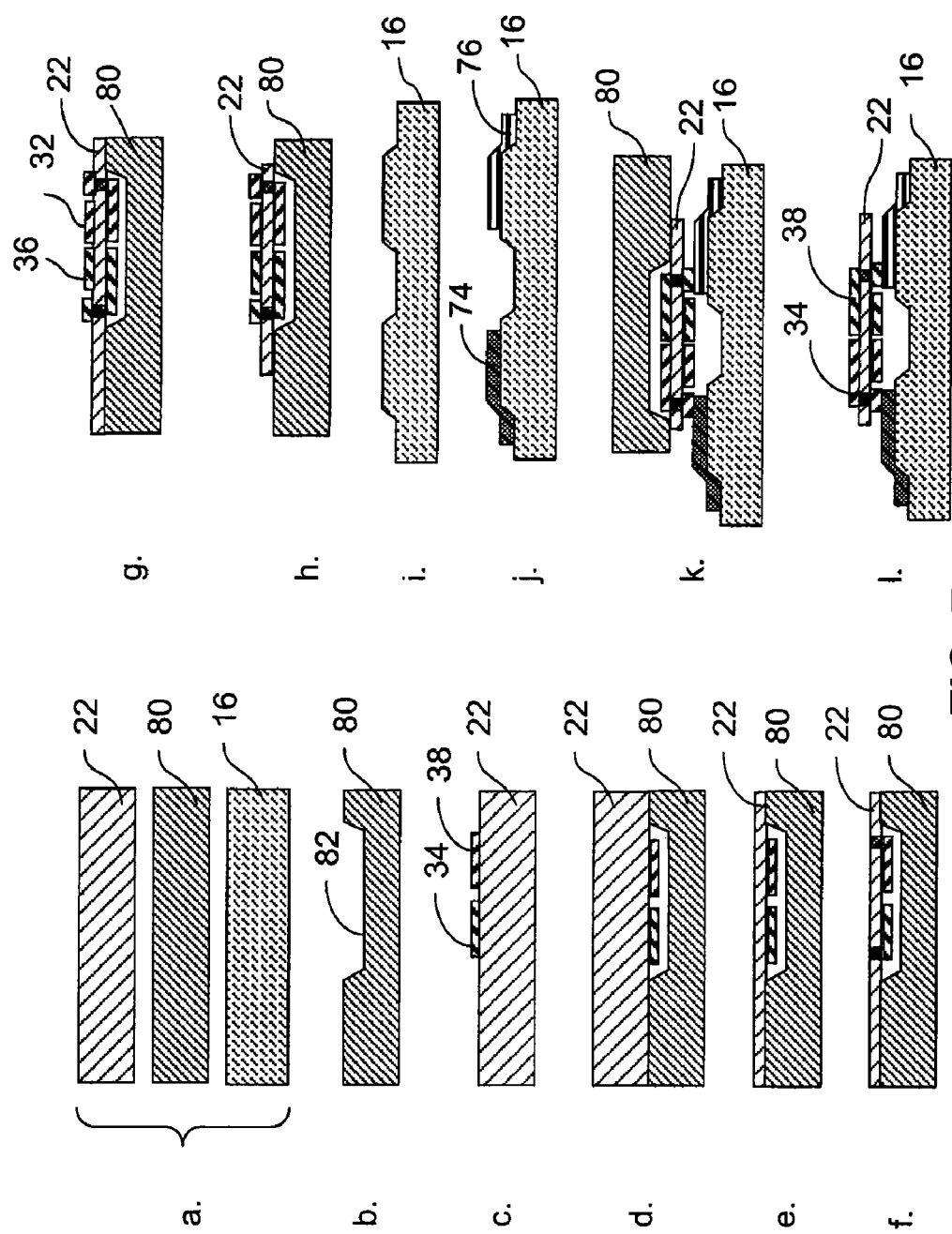

The fabrication sequences and methods for fabricating an integrated MEMS switch and filter 10 is shown in FIGS. 5, 6 and 7, and the flow diagrams of FIGS. 8A to 8C and FIGS. 9A to 9B.

FIG. 5 shows the fabrication sequence for fabricating a MEMS switch 12, and FIG. 6 shows the fabrication sequence for fabricating a filter 14. FIG. 7 shows a fabrication sequence for fabricating connections so that the filter 14 does not have floating metal, as discussed above. It should be understood that the fabrication sequence accommodates simultaneous performing the fabrication sequences shown in FIGS. 5, 6 and 7. Also FIGS. 5, 6 and 7 show the fabrication for only one MEMS switch 12 or one filter 14; however, according to the present disclosure multiple MEMS switches 12 and multiple filters 14 can be fabricated simultaneously and connected together to form integrated MEMS switches and filters. In FIGS. 5, 6 and 7 each fabrication sequence is labeled a. through l. According to the present disclosure each a., each b. and so on can be performed simultaneously. For example, each the fabrication sequence in shown in FIGS. 5c, 6c and 7c can be performed simultaneously. The method of simultaneously fabricating integrated MEMS switches and filters is further detailed in the flow diagrams of FIGS. 8A to 8C and FIGS. 9A to 9B.

In reference to FIGS. 5a, 6a and 7a the starting materials are shown as quartz substrate 22, which can be a single crystal quartz substrate with a thickness of about 300 micrometers, a silicon substrate 80 about 500 micrometers thick to serve as a temporary handle for thinning the quartz substrate 22, and a host substrate 16, which can be either silicon or a III-V material such as GaAs or InP.

Figure 8A:
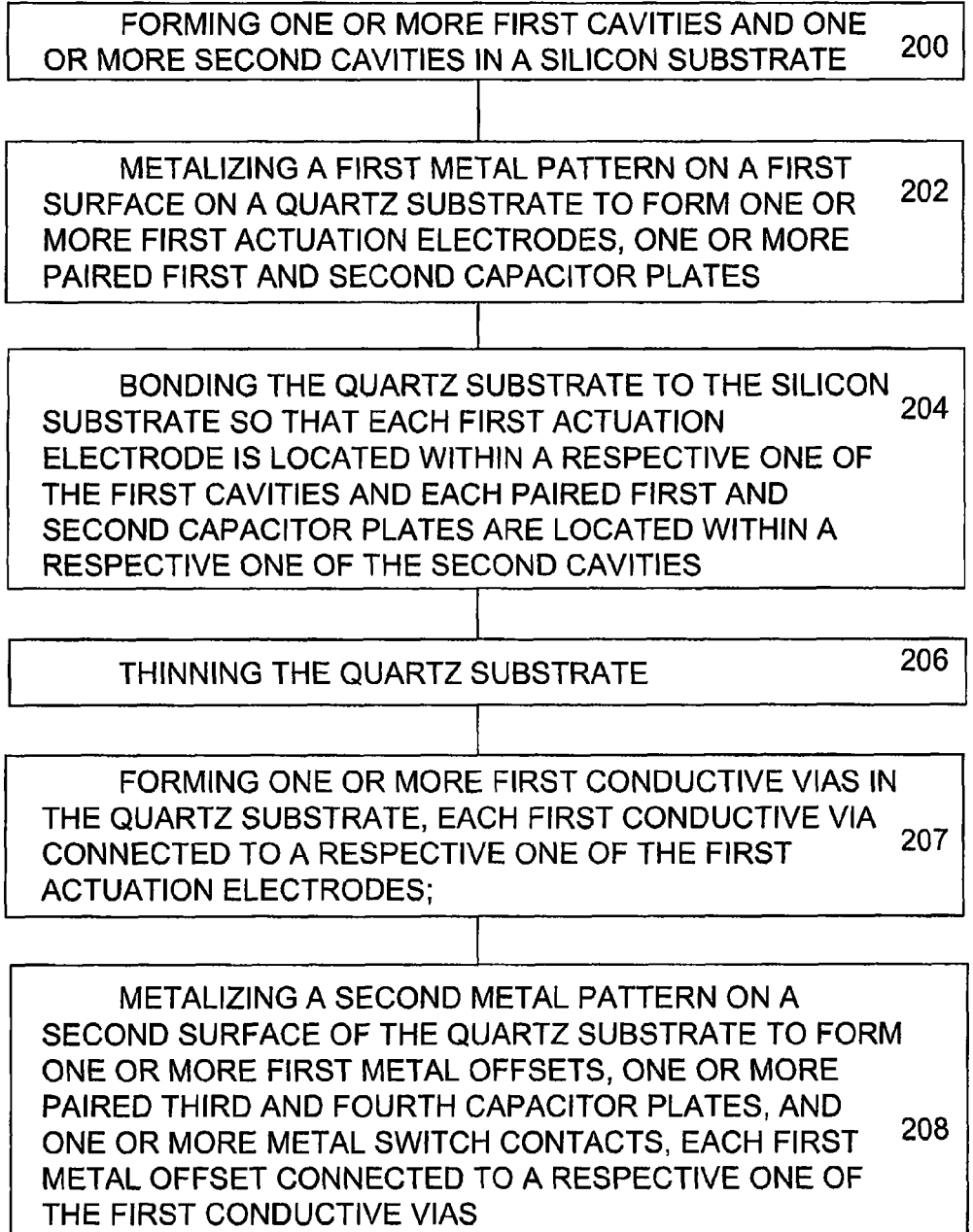

In FIGS. 5b, 6b and 7b, and in step 200 of FIG. 8A, the silicon substrate 80 is etched to create a plurality of cavities 82 in the silicon substrate. Each cavity will used for one MEMs switch or one filter. The etching can be performed by any of the well known methods to etch silicon.

In FIGS. 5c, 6c and 7c and in step 202 of FIG. 8A, a first surface of the quartz substrate is metalized with 200 Å Ti/1000 Å Au to form a first metal actuator electrode 24 for each MEMS switch to be fabricated, as shown in FIG. 5c, and also metalized to form two capacitor plates 34 and 38 for each filter to be fabricated, as shown in FIGS. 6c and 7c.

In FIGS. 5d, 6d and 7d and in step 204 of FIG. 8A, the quartz substrate 22 is bonded to the silicon substrate 80, as shown in FIG. 5d, so that the first actuator electrode 24 is within a cavity 82. As shown in FIGS. 6d and 7d, the first and second capacitor plates 34 and 38 are also positioned within a cavity 82 when the quartz substrate 22 is bonded to the silicon substrate 80. The silicon substrate 80 provides a handle for ease of thinning the quartz substrate 22.

In FIGS. 5e, 6e and 7e and in step 206 of FIG. 8A, the quartz substrate 22 is reduced in thickness from about 300 micrometers to about 10 micrometers using conventional lapping and polishing techniques. The quartz layer is then further reduced to less than 10 micrometers using a $SF_6$ based plasma etch in an inductively-coupled, high-density plasma etcher.

In FIGS. 5f, 6f and 7f and in step 207 of FIG. 8A, a deep reactive ion etching (DRIE) process with $C_{F4}$ chemistry is used to form holes in the quartz substrate 22 for conductive via 64, in FIG. 5f, and conductive vias 71 and 75 in FIG. 7f. The holes are then metalized with (200 Å Ti/1000 Å Au) to form conductive vias through the quartz substrate. This step is further described in step 230 of FIG. 9A.

In FIGS. 5g, 6g and 7g and in step 208 of FIG. 8A, a second surface of the quartz substrate is metalized to form metal offset 62 and metal switch contact 26, as shown in FIG. 5g, a first capacitor plate 32 and a second capacitor plate 36, as shown in FIG. 6g, and, metal offsets 73 and 77 as shown in FIG. 7g, if connection to the floating capacitor plates 32 and 36 is desired. This step is further described in step 232 of FIG. 9A.

In FIGS. 5h, 6h and 7h and in step 210 of FIG. 8A, the quartz substrate is then patterned and etched using a second DRIE step to form first quartz substrates for the MEMS switches and second quartz substrates for the filters.

In FIGS. 5i, 6i and 7i and in step 212 of FIG. 8A, the host substrate 16 is first patterned and etched to create approximately 5 micrometer tall protrusions on its surface.

Then, in FIGS. 5j, 6j and 7j and in step 214 of FIG. 8A, metal (200 Å Ti/5000 Å Au) is deposited on the host substrate 16 to form metal anchor 40, first signal line 18, second signal line 20, and second actuator electrode 60 for each MEMS switch, as shown in FIG. 5j, and metal anchors 70 and 72, as shown in FIG. 6j, and metal anchors 74 and 76, as shown in FIG. 7j.

Next in FIGS. 5k, 6k and 7k and in step 216 of FIG. 8A, the product shown in FIGS. 5h, 6h and 7h (silicon substrate with metalized quartz substrates) is first aligned to the host substrate using a bond aligner and then thermal compression bonded at 300° C. in a wafer bonder using a compression pressure of 10 MPa. This step connects metal anchor 40 to metal offset 62, metal anchor 70 to third capacitor plate 32, metal anchor 72 to fourth capacitor plate 36, metal anchor 74 to metal offset 73, and metal anchor 76 to metal offset 77. This step is further described in step 234 of FIG. 9B.

Next in FIGS. 5l, 6l and 7l and in step 218 of FIG. 8A, the silicon substrate 80 is removed using a dry $SF_6$ plasma etch.

By using the fabrication sequences and methods described above integrated MEMS switches and filters 10 may be fabricated for use in many applications.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . ." and no method or process step herein is to be construed under those provisions unless the step, or steps, are expressly recited using the phrase "comprising the step(s) of . . . ."

What is claimed is:

1. A method for fabricating integrated micro-electro-mechanical system (MEMS) switches and filters, the method comprising:
    forming one or more first cavities and one or more second cavities in a silicon substrate;
    metalizing a first metal pattern on a first surface on a quartz substrate to form one or more first actuation electrodes, one or more paired first and second capacitor plates;
    bonding the quartz substrate to the silicon substrate so that each first actuation electrode is located within a respective one of the first cavities and each paired first and second capacitor plates are located within a respective one of the second cavities;
    thinning the quartz substrate;
    forming one or more first conductive vias in the quartz substrate, each first conductive via connected to a respective one of the first actuation electrodes;
    metalizing a second metal pattern on a second surface of the quartz substrate to form one or more first metal offsets, one or more paired third and fourth capacitor plates, and one or more metal switch contacts, each first metal offset connected to a respective one of the first conductive vias;
    etching the quartz substrate to form a plurality of first quartz substrates and a plurality of second quartz substrates, each first quartz substrate having a respective one of the first metal offsets, a respective one of the first conductive vias, a respective one of the first actuation electrodes and a respective one of the metal switch contacts, and each first quartz substrate having a respective one of the paired first and second capacitor plates and a respective one of the paired third and fourth capacitor plates;
    forming one or more protrusions on a host substrate;
    metalizing a third metal pattern on the host substrate to form a plurality of first metal anchors, a plurality of second metal anchors, a plurality of third metal anchors, one or more second actuation electrodes, one or more first metal signal lines, and one or more second signal lines, each first, second and third metal anchor overlaying a respective one of the protrusions;
    connecting each first metal offset to a respective one of the first metal anchors on the host substrate so that each first actuation electrode is substantially aligned over a respective one of the second actuation electrodes, each metal switch contact is aligned over a respective one of the first signal lines and over a respective one of the second signal lines, each paired first and second capacitor plates are substantially aligned over a respective one of the paired third and fourth capacitor plates, each third capacitor plate is electrically connected to a respective one of the second metal anchors, each fourth capacitor plate is electrically connected to a respective one of the third metal anchors, and at least one of the second metal anchors is connected to a respective one of the second signal lines in order to form an integrated MEMS switch and filter; and
    removing the silicon substrate.

2. The method of claim 1 wherein:
    the step of forming one or more first conductive vias, each first conductive via connected to a respective one of the first actuation electrodes further comprises:
        forming one or more second conductive vias in the quartz substrate, each second conductive via connected to a respective one of the first capacitor plates or to a respective one of the second capacitor plates;
    the step of metalizing a second metal pattern on a second surface of the quartz substrate to form one or more first metal offsets, one or more paired third and fourth capacitor plates, and one or more metal switch contacts, each first metal offset connected to a respective one of the first conductive vias further comprises:
        metalizing the second surface of the quartz substrate to form one or more second metal offsets, each second metal offset connected to a respective one the second conductive vias; and
    the step of connecting each first metal offset to a respective one of the first metal anchors on the host substrate so that each first actuation electrode is substantially aligned over a respective one of the second actuation electrodes, each metal switch contact is aligned over a respective one of the first signal lines and over a respective one of the second signal lines, each paired first and second capacitor plates are substantially aligned over a respective one of the paired third and fourth capacitor plates, each third capacitor plate is electrically connected to a respective one of the second metal anchors, each fourth capacitor plate is electrically connected to a respective one of the third metal anchors, and at least one of the second metal anchors is connected to a respective one of the second signal lines in order to form an integrated MEMS switch and filter further comprises:
    connecting each second metal offset to a respective one of a plurality of fourth metal anchors on the host substrate.

3. The method of claim 1 wherein the host substrate is silicon or is material selected from the group consisting of III-V elements.

4. The method of claim 1 wherein the quartz substrate is a single crystal quartz substrate and has a thickness of about 300 micrometers.

5. The method of claim 1 wherein the silicon substrate has a thickness of about 500 micrometers.

6. The method of claim 1 wherein forming one or more first cavities and one or more second cavities in a silicon substrate comprises etching.

7. The method of claim 1 wherein metalizing a first metal pattern comprises metalizing with 200 angstroms of Ti.

8. The method of claim 1 wherein metalizing a first metal pattern comprises metalizing with 1000 angstroms of Au.

9. The method of claim 1 wherein the step of bonding the quartz substrate to the silicon substrate further comprises reducing the thickness of the quartz substrate to about 10 micrometers.

10. The method of claim 9 comprising plasma etching.

11. The method of claim 1 wherein forming one or more first conductive vias and one or more second conductive vias in the quartz substrate comprises:
    etching holes in the quartz substrate using deep reactive ion etching with $CF_4$; and
    metalizing the holes.

12. The method of claim 1 wherein etching the quartz substrate to form a plurality of first quartz substrates and a plurality of second quartz substrates comprises patterning and etching the quartz substrate using a using deep reactive ion etching with $CF_4$.

13. The method of claim 1 wherein forming one or more protrusions on a host substrate comprises etching the host substrate.

14. The method of claim 1 wherein the protrusions are about 5 micrometers tall.

15. The method of claim 1 wherein bonding the bonded quartz substrate and silicon substrate to the host substrate comprises bonding at 300 degrees centigrade using a compression pressure of 10 MPa.

16. The method of claim 1 wherein removing the silicon substrate comprises etching.

17. The method of claim 1 wherein removing the silicon substrate comprises plasma etching.

18. The method of claim 2 further comprising connecting each fourth metal anchor to an electrical ground.

19. The method of claim 2 further comprising connecting each fourth metal anchor to an electrical ground.

20. The method of claim 1 wherein the second metal switch contact comprises an input signal line and an output signal line.

21. The method of claim 20 wherein the output signal line is electrically connected to at least one second metal anchor.

* * * * *